United States Patent [19]

Hullinger, Jr. et al.

[11] 4,097,811
[45] Jun. 27, 1978

[54] RADIO WITH AUTOMATIC SCAN TUNING

[75] Inventors: Lee Hullinger, Jr., Greentown; Leo E. Noble, Russiaville, both of Ind.

[73] Assignee: General Motors Corporation, Detroit, Mich.

[21] Appl. No.: 773,384

[22] Filed: Mar. 2, 1977

[51] Int. Cl.² .............................................. H04B 1/32
[52] U.S. Cl. .................................. 325/470; 325/457; 334/18
[58] Field of Search ............... 325/312, 318, 319, 452, 325/457, 468, 469, 470, 471; 334/15, 16, 18, 19, 24

[56] References Cited

U.S. PATENT DOCUMENTS

| | | | |
|---|---|---|---|
| 2,906,875 | 9/1959 | Molinaro | 325/470 |
| 3,467,870 | 9/1969 | Aoyama | 325/470 |
| 3,560,858 | 2/1971 | Sakai et al. | 325/470 |

Primary Examiner—Robert L. Griffin
Assistant Examiner—Jin F. Ng
Attorney, Agent, or Firm—Robert M. Sigler

[57] ABSTRACT

In a radio having power tuning apparatus activated by a latching switch in a sweep position and deactivated by the latching switch in a stop position, the radio further having apparatus responsive to a received radio frequency signal for switching the latching switch to its stop position, first apparatus is provided for switching the latching switch to its sweep position, second apparatus is provided for manually disabling the first apparatus, third apparatus is provided for activation of the first apparatus, if not disabled, a first predetermined time delay after the switching of the latching switch to its stop position, the first predetermined time delay permitting recognition of a received radio signal and activation of the second apparatus, and fourth apparatus is provided for deactivating the first means a second predetermined time delay after the switching of the latching switch to its sweep position, the second delay being just long enough to ensure latching of the latching switch in its sweep position.

3 Claims, 1 Drawing Figure

U.S. Patent
June 27, 1978
4,097,811
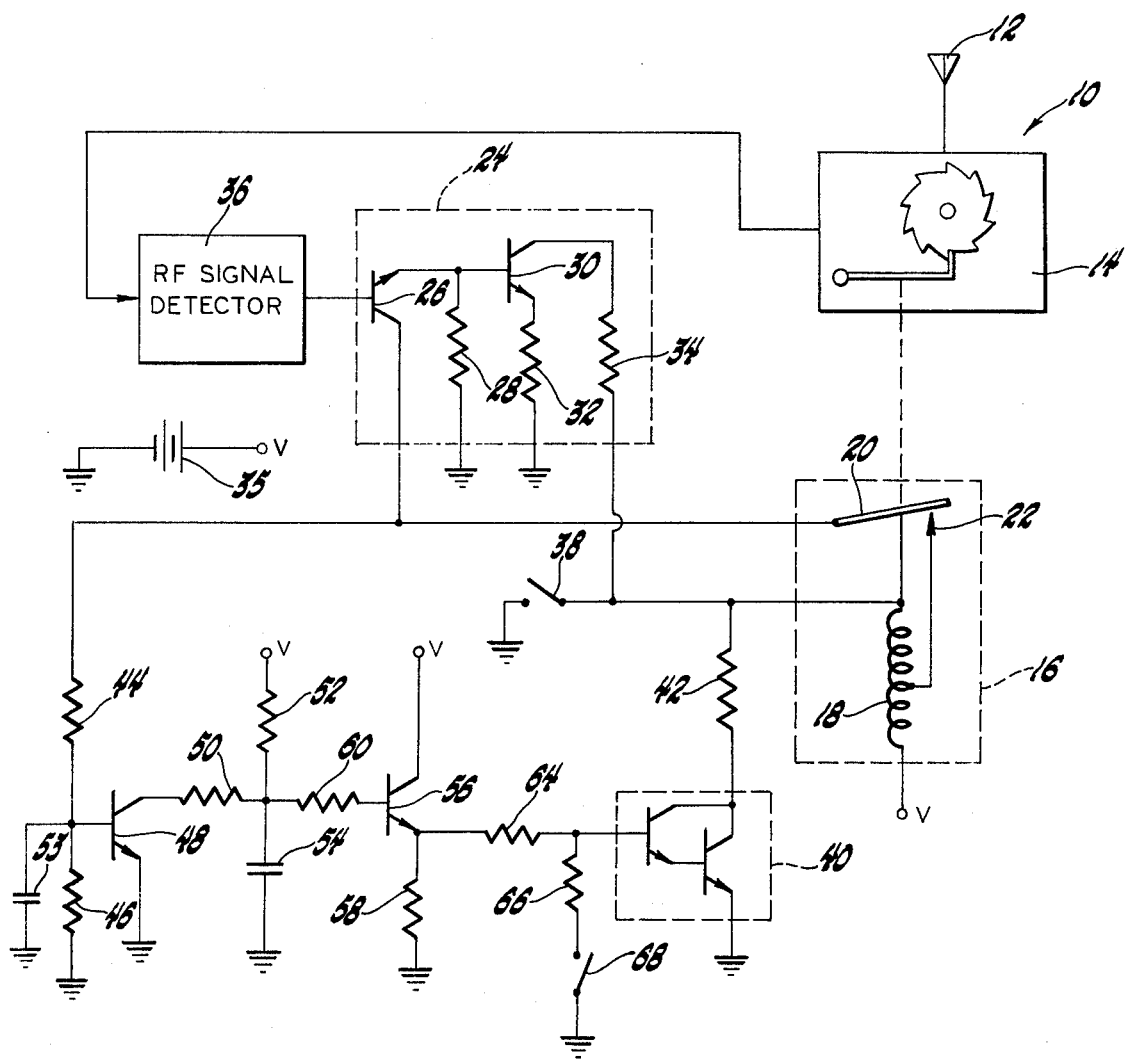

RADIO WITH AUTOMATIC SCAN TUNING

BACKGROUND OF THE INVENTION

This invention relates to radios with tuners having power tuning means activatable to scan through a range of frequencies and means responsive to a received radio frequency signal for deactivating said power tuning means to receive said signal. Such radios, available for years on automobiles, have been known as signal seeking radios.

It has been suggested in the past that such radios could be modified to scan automatically and repeatedly from one received signal to the next, with retention of each signal for a predetermined time to allow recognition of the signal and subsequent deactivation of the power tuning mechanism to retain said signal. A suggestion of this concept appears in the U.S. Patent to Molinaro No. 2,906,875; and some circuits are disclosed in said patent which purportedly embody this concept.

This invention is a modification of the signal seeking radios produced by the assignee of this invention for use on its manufactured automobiles. Such radios have included power tuning means activatable by a latching switch having a sweep position in which said power tuning means is activated, the latching switch often having a slight delay in latching in the sweep position, and a stop position in which said power tuning means is deactivated. Such radios have further included means responsive to a received radio frequency signal for switching the latching switch to its stop position and means manually activatable to switch the latching switch to its sweep position. The circuits shown in the aforementioned Molinaro patent are not suited for addition to these radios.

SUMMARY OF THE INVENTION

This invention adds additional means for switching the latching switch to its sweep position independently of said manually activatable means and further means responsive to the state of the latching switch to change the additional means, after a time delay, to the state corresponding to the opposite state of the latching switch. A long time delay is provided for the activation of the additional means in response to deactivation of the latching switch, so that the radio operator can recognize the signal and actuate manual disabling means before the latching switch is once again activated. A much shorter, but still substantial, time delay is provided in deactivating the additional means in response to activation of the latching switch, this time delay being just sufficiently long to ensure latching of the latching switch before the additional means is deactivated.

Thus the invention comprises a two-way switching time delay circuit which is easily added to a conventional signal seeking radio without costly retooling for changes in the other radio circuits and which allows the user the choice of operating as a signal seeking radio in the traditional manner, that is with manual initiation of sweep for each station, if he desires. Further details and advantages of this invention will be apparent from the accompanying drawing and following description of a preferred embodiment.

DESCRIPTION OF THE PREFERRED EMBODIMENT

Most of the circuit of this invention has been previously disclosed within one year of the filing of this patent application in the 1977 edition of the Radio Service Manual of the Delco Electronics Division of General Motors Corporation, pages E-1 to E-6. The portion of the radio described therein and not described and claimed in this application is a suitable environment for this invention. In addition, the component identification and values shown in that disclosure are suitable for this invention and are incorporates by reference herein.

Referring to the FIGURE, a radio 10 has an antenna 12 and power turning means 14. A relay 16 comprises an actuating coil 18, an armature 20 and a contact 22 connected by a center tap to coil 18.

Latching means 24 for relay 16 comprise an NPN transistor 26 with collector connected to armature 20 and emitter connected through a resistor 28 to ground, and another NPN transistor 30 with emitter connected through a resistor 32 to ground, base connected to the emitter of transistor 26 and collector connected through a resistor 34 and coil 18 to a source of current 35 at potential V, typically a motor vehicle battery or generator. Relay 16 and latching means 24 together comprise a latching switch.

Means are provided for the detection of a radio frequency signal of greater than a predetermined signal strength; and such means are designated in the FIGURE as RF signal detector 36. Such detectors using the radio's automatic gain control are well known in the art; one example is shown in the aforementioned service manual. The output of RF signal detector 36 is connected to the base of transistor 26 in such a way as to turn transistor 26 off when a sufficiently strong RF signal is detected, and otherwise turn it on.

The apparatus described to this point is conventional on signal seeking radios, with the addition of a switch 38, typically a push button, spring biased switch, from the junction of resistor 34 and coil 18 to ground for actuation of signal seeking. In place of such a switch, or in addition, thereto, this invention adds a transistor switch shown as the Darlington pair transistor 40 with collector connected through a resistor 42 to the junction of resistor 34 and coil 18 and emitter grounded. A Darlington pair is preferred rather than a single transistor because of its improved resistance to voltage spikes induced by the opening and closing of armature 20 and contact 22, but the circuit will also work with a single transistor.

A two-way time delay switching circuit to control transistor 40 comprises a voltage divider comprising resistors 44 and 46 connected between armature 20 and ground, an NPN transistor 48 with emitter grounded, base connected to the junction of resistors 44 and 46 and collector connected through resistors 50 and 52 in series to the current source 35. The circuit further includes a capacitor 53 connected between the base of transistor 48 and ground, a capacitor 54 connected between the junction of resistors 50 and 52 and ground and an NPN transistor 56 having an emitter connected through a resistor 58 to ground, a base connected through a resistor 60 to the junction of resistors 50 and 52 and a collector connected to the current source 35.

The circuit finally includes a resistor 64 connected between the emitter of transistor 56 and the base of transistor 40 and a resistor 66 and switch 68 connected in series between the base of transistor 40 and ground. Switch 68 is a manual control switch activatable by the radio listener. When switch 68 is closed, resistors 64 and 66 form a voltage divider providing a low voltage to the base of transistor 40 to prevent its turning on and thus to prevent repeated sweeping. An open switch 68 removes resistor 66 from the circuit and thus allows transistor 56 to turn on transistor 40 for repeated sweeping. Switch 68 is thus seen to be enabling and disabling means for transistor 40.

In normal radio listening, switch 68 is closed, transistor 40 and transistor 30 are both nonconducting, armature 20 and contact 22 are open, power tuning means 14 is deactivated and antenna 12 is ordinarily controlled by manual tuning means, not shown. Armature 20 is grounded through resistors 44 and 46, which renders latching means 24 unresponsive to RF signal detector 36 and further holds transistor 48 in a non-conducting condition. The voltage on capacitor 54 is high; and transistor 56 is thus on. However, closed switch 68 prevents transistor 40 from being turned on.

To initiate repeated sweeping, the radio listener opens switch 68, which removes the shunt current path through resistor 66 from the base of transistor 40 and thus allows it to be activated conductive by transistor 56. Transistor 40 completes a circuit providing current through coil 18 which pulls armature 20 against contact 22, armature 20 mechanically actuating power tuning means 14 to sweep through a range of frequencies.

The closure of armature 20 connects it with the current source 35 through half of coil 18 and contact 22. This causes transistor 26 to turn on, immediately if not station was previously being tuned and the output of RF signal detector 36 is thus high, and after a slight delay if a previously tuned station must first be untuned by the power tuning means 14 and the low output of the RF signal detector 36 thus be changed to a high output. The conduction of transistor 26 turns on transistor 30, which serves as an alternate conduction path through coil 18 to latch relay 16 closed. Thus, whenever a radio frequency signal is being received, there will be a slight time delay between the time that armature 20 closes and the time that a sufficient latching current is established through transistor 30 to retain armature 20 closed.

The closing of armature 20 also connects current source 35 with the voltage divider comprising resistors 44 and 46 and capacitor 53. Capacitor 53 is thus charged through resistor 44 until the base-emitter voltage of transistor 48 becomes high enough to render it conducting, whereupon it provides a discharge path for capacitor 54 through resistor 50. Resistor 50 is quite small in resistance so that capacitor 54 is very quickly discharged. It is important that capacitor 54 be quickly discharged for a reason to be explained at a later point in this specification.

The discharge of capacitor 54 renders transistor 56 non-conducting, which, in turn, renders transistors 40 non-conducting. The major portion of the delay between the closure of armature 20 and the deactivation of transistor 40 is due to the charging of capacitor 53 through resistor 44, which is much slower than the discharge of capacitor 54 through resistor 50. This time delay is of a predetermined sufficient duration to ensure that the latching current through transistor 30 is established before transistor 40 is deactivated, even if the radio is tuned to a station so that there is a delay in the establishment of the latching current.

Meanwhile, power tuning means 14 continues to sweep until RF signal detector 36 detects a received radio frequency signal and generates a low output, turning off transistors 26 and 30 to allow armature 20 to open. This halts the power tuning means 14 directly on the received station and removes the potential V from the voltage divider comprising resistors 44 and 46 and capacitor 53.

With armature 20 open, capacitor 53 discharges through resistor 46 and transistor 48 relatively quickly so that the base-emitter voltage of transistor 48 is reduced toward cutoff. As transistor 48 attempts to turn off, however, capacitor 54 begins to charge from current source 35 through resistor 52. Resistor 52 is chosen so that the time constant of capacitor 54 and resistor 52 is comparatively large. The base-emitter voltage of transistor 56 thus rises slowly, the turning on of transistor 56 being thus delayed by a predetermined time sufficiently long to permit the radio listener to recognize the received signal, decide whether he wishes to continue receiving it or not and act, if he wishes to continue receiving it, by closing switch 68 before transistor 56 turns on. If switch 68 is closed at this time, transistor 56 turning on will have no effect on transistor 40, and the radio will remain tuned to the received frequency. If switch 68, however, remains open, the turning on of transistor 56 turns on transistor 40 to cause the closure of armature 20 against contact 22 and a repetition of the cycle.

The cycle will be repeated indefinitely until switch 68 is closed or the radio itself is turned off, the sweeping proceeding through the range of frequencies, stopping on each received RF signal, remaining tuned to that signal for a predetermined time delay and then automatically resuming sweeping to the next signal.

It can be seen that there are two significant time delays involved in the operation of this circuit. When armature 20 opens, there is a first time delay before transistor 40 is activated to close armature 20 again. This time delay is mainly determined by the time constant of capacitor 54 charging through resistor 52. The contribution of the discharge of capacitor 53 to this time delay is sufficiently small that it does not affect the time delay significantly.

The second time delay occurs between the closing of armature 20 and the following deactivation of transistor 40. This time delay is primarily determined by the charging of capacitor 53 through resistor 44, the discharge rate of capacitor 54 through resistor 50 being so fast that capacitor 54 will be completely discharged, even after the time delay resulting from capacitor 53, before power tuning means 14 can advance the tuner to the next received radio frequency signal. It is important that capacitor 54 be completely discharged before the next radio frequency signal is received, so that the time the radio remains tuned to that signal be consistent from one station to the next. If capacitor 54 were not completely discharged before a new station was found and the charging of capacitor 54 through resistor 52 began, the time required to raise the base-emitter voltage of transistor 56 to its turn on level might be greatly reduced, causing a reduction in the time spent by the radio on that station and possible frustration to the radio listener who desires to retain the station but cannot act quickly enough to do so. It is for this reason, also, that capacitor 53 is necessary to generate the second or latching time delay, even though it might appear from a casual look at the FIGURE that the same result could be achieved by adjusting the value of resistor 50 so that the discharge of capacitor 54 following the closure of armature 20 would create that time delay. It is found that, if this approach is attempted, this low discharge rate of capacitor 54 can sometimes cause it to be not fully discharged when the next station is tuned, with the undesirable result described above.

Capacitor 53, which replaces a capacitor referred to as C173 in the above-identified service manual as the preferred embodiment of this invention has a value in this circuit of 250 microfarads.

It should be apparent that, if switch 38 is retained in the circuit, the radio operator has the option of leaving switch 68 closed and repeatedly initiating actuation of power tuning means 14 by repeatedly actuating switch 38, as in the prior art. Thus this circuit permits the option of traditional signal seeking radio operation, which some may prefer.

The embodiment described above is a preferred embodiment; but equivalents will occur to those skilled in the art after reading this specification. Therefore the scope of this invention should be limited only by the claims which follow.

The embodiment of the invention in which an exclusive property or privilege is claimed are defined as follows:

1. In a radio having power tuning means and means responsive to a received radio frequency signal for generating an on-station signal, apparatus comprising, in combination:
    a latching switch having a sweep position and being effective in said sweep position to activate the power tuning means to sweep through a range of frequencies within a frequency band and further having a stop position and being effective in said stop position to deactivate the power tuning means to remain tuned to a single radio frequency, the latching switch being characterized by a time delay in latching in the sweep position;
    circuit means responsive to the on-station signal for switching the latching switch to its stop position,
    first means for switching the latching switch to its sweep position to thereby initiate a sweep of the power tuning means;
    second means manually activatable to disable the first means whereby the radio remains tuned to a single radio frequency;
    third means responsive to the latching switch in its stop position to activate the first means, if not disabled, after a first predetermined time delay of sufficient length to permit recognition of a received radio signal and activation of the second means;
    fourth means responsive to the latching switch in its sweep position to deactivate the first means after a second predetermined time delay of just sufficient length to ensure latching of the latching switch in its sweep position, whereby the power tuning means resumes sweeping through the range of frequencies after stopping at each received radio frequency signal, until the second means is activated.

2. In a radio having power tuning means activated by a latching switch in a sweep position to sweep through a range of frequencies within a radio frequency bend and deactivated by the latching switch in a stop position to remain tuned to a single radio frequency, the latching switch being characterized by a delay in latching in the sweep position, and means responsive to a received radio frequency signal to switch the latching switch to its stop position, the improvement comprising:
    first means for switching the latching switch to its sweep position;
    second means manually activatable to disable the first means, whereby the radio remains tuned to a single radio frequency;
    first capacitor means;
    third means responsive to the latching switch in its sweep position to charge the first capacitor means at a first rate;
    fourth means responsive to the latching switch in its stop position to discharge the first capacitor means at a second rate;
    second capacitor means effective, when charged, to activate the first means, if not disabled, and, when discharged, to deactivate the first means;
    fifth means effective, when activated, to charge the second capacitor means at a third rate;
    sixth means effective, when activated, to discharge the second capacitor means at a fourth rate; and
    switch means responsive to the first capacitor means, when discharged, to activate the fifth means, the charging of the second capacitor means at the third rate producing a third predetermined delay in activation of the latching switch of sufficient length to permit recognition of the radio frequency signal and activation of the second means to retain the radio frequency signal and the discharge of the first capacitor means at the second rate producing a second predetermined delay of negligible duration with respect to the third predetermined delay, the switch means further being responsive to the first capacitor means when charged to activate the sixth means, the charging of the first capacitor means at the first rate producing a first predetermined delay in the activation of the sixth means of just sufficient length to ensure latching of the latching switch in its sweep position and the discharge of the second capacitor means at the fourth rate producing a fourth predetermined delay of negligible duration compared to the first predetermined delay, whereby the power tuning means can be activated to sweep through the range of frequencies, stopping at each received radio frequency signal for a predetermined time to permit recognition thereof, until deactivated.

3. In a radio having power tuning means activated by a latching switch in a sweep position to sweep through a range of frequencies in a frequency band and deactivated by the latching switch in a stop position to remain tuned to a single radio frequency, the latching switch being characterized by a time delay in latching in the sweep position, and means responsive to a received radio frequency signal for switching the latching switch to its stop position, the improvement comprising:
    first means for switching the latching switch to its sweep position;
    second means manually activatable to disable the first means whereby the radio remains tuned to a single radio frequency;
    a current source at a potential greater than ground;
    a first capacitor;
    first and second resistors;
    third means responsive to the latching switch in its sweep position to connect the first capacitor to the current source through the first resistor for charging at a first rate and further responsive to the latching switch in its stop position to disconnect the first capacitor from the current source;

a first transistor with collector connected to the current source, emitter grounded and base connected to the first capacitor and to ground through the second resistor, whereby the first transistor is rendered conductive by the latching switch in its sweep position after a first predetermined delay caused by the charging of the capacitor at the first rate and is further rendered non-conductive by the latching switch in its stop position after a second predetermined delay caused by the first capacitor through the second resistor at a second rate;

third and fourth resistors connected in series between the current source and the first transistor collector;

a second capacitor connected between the junction of the third and fourth resistors and ground, the second capacitor being chargeable from the current source through the third resistor at a third rate when the first transistor is non-conductive and dischargeable through the fourth resistor and first transistor at a fourth rate when the first transistor is conductive;

fourth means connecting the second capacitor to the first means, the fourth means being effective to activate the first means when the second capacitor is charged and deactivate the first means when the second capacitor is discharged, the first means thus being activated by the latching switch in its stop position after a third predetermined delay due to the charging of the second capacitor at the third rate, the third predetermined delay being of sufficient duration to permit recognition of a received radio frequency signal and activation of the second means and the discharge of the first capacitor at the second rate producing a second predetermined delay of negligible duration compared to the third predetermined delay, the first means further being deactivated by the latching switch in its sweep position after the first predetermined delay, the first predetermined delay being just sufficiently long to ensure latching of the latching switch in its sweep position, the discharge of the second capacitor at the fourth rate producing a fourth predetermined delay of negligible duration compared to the first predetermined delay, whereby the power tuning means can be activated to sweep through the range of frequencies, stopping at each received radio frequency signal for a predetermined time to permit recognition thereof, until deactivated.

* * * * *

UNITED STATES PATENT AND TRADEMARK OFFICE
CERTIFICATE OF CORRECTION

PATENT NO. : 4,097,811
DATED : June 27, 1978
INVENTOR(S) : Lee Hullinger, Jr. and Leo E. Noble It is certified that error appears in the above-identified patent and that said Letters Patent are hereby corrected as shown below:

Column 7, claim 3, line 12, after "the" insert -- discharge of the --.

In the abstract, line 15, "means" should read -- apparatus --.

Column 3, line 32, "not" should read -- no --.

Signed and Sealed this

Sixth Day of February 1979

[SEAL]

Attest:

RUTH C. MASON
*Attesting Officer*

DONALD W. BANNER
*Commissioner of Patents and Trademarks*